United States Patent [19]

Hirayama

[11] Patent Number: 4,857,975
[45] Date of Patent: Aug. 15, 1989

[54] GAAS FIELD EFFECT TRANSISTOR HAVING A WSI SCHOTTKY GATE ELECTRODE IMPROVED FOR HIGH-SPEED OPERATION

[75] Inventor: Hiromitsu Hirayama, Tokyo, Japan

[73] Assignee: NEC Corporation, Tokyo, Japan

[21] Appl. No.: 85,978

[22] Filed: Aug. 14, 1987

[30] Foreign Application Priority Data

Aug. 15, 1986 [JP]   Japan .................................. 61-191330

[51] Int. Cl.[4] .............................................. H01L 29/80
[52] U.S. Cl. .......................................... 357/22; 357/15
[58] Field of Search .................. 357/22 E, 22 I, 22 R, 357/22 G, 22 GR, 22 S, 15, 228

[56] References Cited

U.S. PATENT DOCUMENTS

| 4,498,093 | 2/1985 | Allyn et al. | 357/22 I |
| 4,532,532 | 7/1985 | Jackson | 357/22 I |
| 4,566,021 | 1/1986 | Yokoyama | 357/22 I |
| 4,729,966 | 3/1988 | Koshino et al. | 357/22 I |

FOREIGN PATENT DOCUMENTS

| 0166112 | 1/1986 | European Pat. Off. | 357/22 |
| 50128599 | 4/1977 | Japan | 357/22 S |
| 58-53862 | 3/1983 | Japan | 357/22 |
| 58-79770 | 5/1983 | Japan | 357/22 |
| 60-100473 | 6/1985 | Japan | 357/22 |
| 1180186 | 2/1970 | United Kingdom | 357/22 S |

Primary Examiner—Andrew J. James
Assistant Examiner—Mark Prenty
Attorney, Agent, or Firm—Helfgott & Karas

[57] ABSTRACT

A GaAs Schottky gate field effect transistor includes a GaAs substrate, source and drain electrodes ohmically attached to separated first and second parts of the GaAs substrate and a gate electrode of WSi contacted with a third part of the GaAs substrate between the first and second parts of the GaAs substrate, the gate electrode having a gate width of 30 to 60 μm.

10 Claims, 2 Drawing Sheets

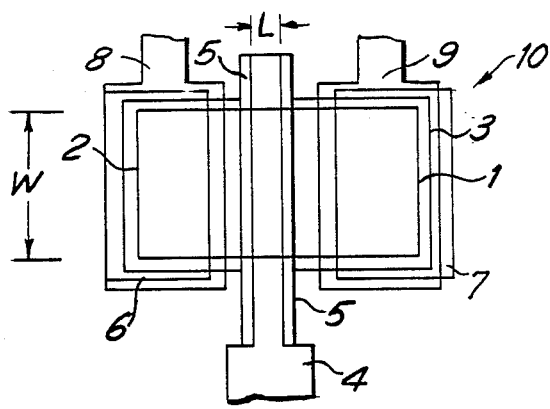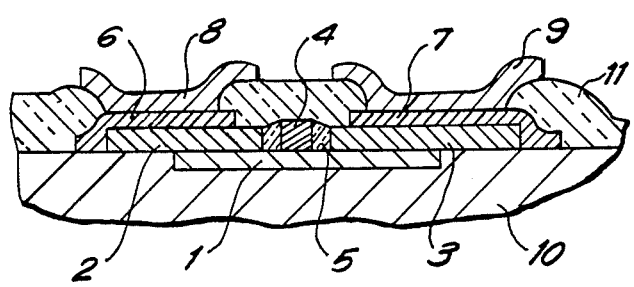
FIG. 1  FIG. 2
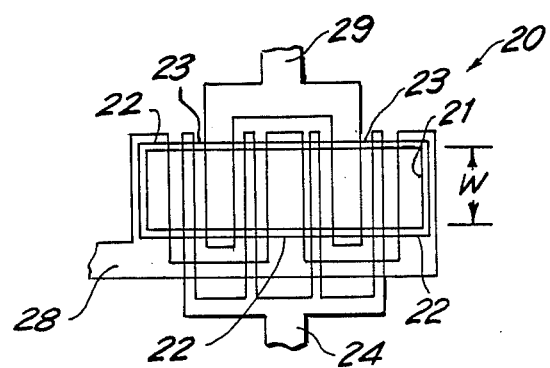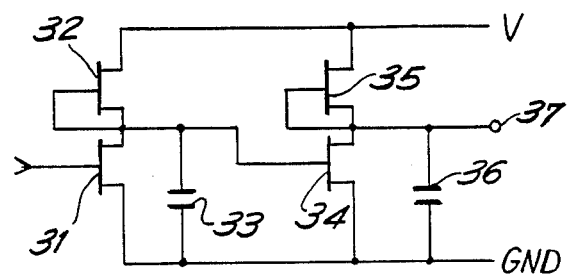
FIG. 5  FIG. 6

GAAS FIELD EFFECT TRANSISTOR HAVING A WSI SCHOTTKY GATE ELECTRODE IMPROVED FOR HIGH-SPEED OPERATION

BACKGROUND OF THE INVENTION

1. Field of the Invention:

This invention relates to a GaAs field effect transistor (hereinafter, referred to an FET for a field effect transistor) having a WSi schottky gate electrode, and more particularly to an improvement of the WSi (tangsten silicide) schottky gate electrode for a high-speed operation.

2. Description of the Related Art:

WSi has been conventionally used for a gate electrode of a junction gate FET having a high transfer-conductance, because WSi has a relatively small resistivity and is not damaged in a high-temperature process of 800° C. or above. Especially, due to such property of WSi, the GaAs FET can be formed by a self-alignment process in which the gate WSi is used for a mask for forming source and drain regions by impurity ion-implantation. The use of the self-alignment process realizes a very small GaAs FET. Thus, a highly-integrated, high-speed logic IC can be obtained by using the WSi Schottky gate GaAs FET's.

However, WSi has a low resistivity, compared to polycrystalline Si, but it has a high resistivity, compared to Al. For example, WSi has a resistivity of 3.6 K$\Omega$/mm with a thickness of 0.5 $\mu$m and a width of 1 $\mu$m. This resistivity increases a paracitic gate resistance to decrease a switching speed of the FET or to deform the waveform of output pulse.

Especially, in order to produce a sufficient output voltage with a high-speed operation, it is required to use FET's having a wide gate electrode for a large current operation. If an output of 1 volt is required with a 50 ohms-load, the gate width of several hundreds $\mu$m is necessary. For example, in a case where the FET has a WSi gate electrode having a thickness of 0.5 $\mu$m, a gate length of 1.0 $\mu$m and a gate width of 500 $\mu$m, the parasitic gate resistance becomes an order of 2 K$\Omega$. Such large gate resistance considerably affects the switching speed and the output waveform.

These degradations of switching speed and the output waveform are also affected from capacitances such as the capacitance accompanying with output wirings and the coupling capacitance existing between the FET itself and adjacent wirings. Particularly, in GaAs IC, the effect of the coupling capacitance is not ignorable, because the electric field from the FET widely extends through the semi-insulating substrate in which FET's are formed.

Under these circumstances, it is easily understood that, if the gate width is decreased, the FET can be made small to decrease the parasitic gate resistance and the coupling capacitance. This measure is accompanied by a decrease in operating current and does not give a complete solution for the degradations. The coupling capacitance depends on circuit design, wiring pattern, manufacturing condition and so on and is difficult to be controlled. Therefore, the relationship between the operational speed and the gate width has never been examined.

SUMMARY OF THE INVENTION

It is a primary object of the present invention to provide a WSi Schottky gate FET operable at high speed irrespective of capacitances applied thereto.

It is a more-specific object of the present invention to provide a WSi Schottky gate FET suitable for being formed in a GaAs IC and operable at high speed irrespective of parasitic or stray capacitances applied thereto.

According to the present invention, there is provided a WSi Schottky gate FET having a GaAs region of one conductivity type, a source and drain electrodes attached to separate parts of the GaAs region and a WSi gate electrode attached to the GaAs region between the separate parts, the WSi gate electrode having a gate width of 30 to 60 $\mu$m in a direction perpendicular to a line from the part attached to the drain electrode to the other part attached to the source electrode.

According to our investigation of the relationship between delay time of output from input and the coupling capacitance, the delay time becomes minimum with a gate width of 30 to 60 $\mu$m irrespective of the coupling capacitances of 10 to 60 fF. By using the gate electrode having the gate width of 30 to 60 $\mu$m, the capacitance applied to the FET can be ignored for circuit design. This considerably facilitates the formation of GaAs IC with WSi Schottky gate FET's.

BRIEF DESCRIPTION OF DRAWINGS

The above and further objects, features and advantages of the present invention will become more apparent from the following detailed description taken in conjunction with the accompanying drawings, wherein:

FIG. 1 is a plan view of a first embodiment of the present invention;

FIG. 2 is a sectional view of the first embodiment shown in FIG. 1;

FIG. 5 is a plan view of a second embodiment of the present invention; and

FIG. 6 is an example of circuit diagram of GaAs IC using FET's of the first and second embodiments of the present invention.

DESCRIPTION OF THE PREFERRED EMBODIMENTS

Figure 3:
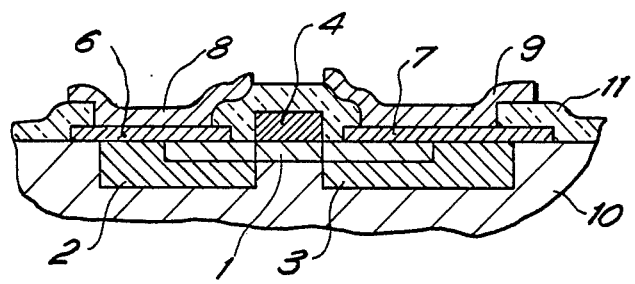
FIG. 3 is a sectional view of a modification of the first embodiment shown in FIG. 1.

A first preferred embodiment is an FET having a single finger gate as shown in FIGS. 1 and 2. An active region of N-type GaAs is formed in a semi-insulating GaAs substrate 10 by ion-implantation of silicon ions. An example of impurity concentration in the active region 1 is $10^{17}$ cm$^{-3}$ to $4 \times 10^{17}$ cm$^{-3}$. WSi having a composition of 5 parts of W and 3 parts of Si are deposited on the substrate 10 by sputtering so as to cross the active region 1 with a thickness of 2,000 Å to 5,000 Å, preferably 5,000 Å. The WSi contacts the active region 1 to form a Schottky junction therewith and acts as a gate electrode 4. The gate length "L" is selected within 0.5–1.5 $\mu$m, preferably 0.8 $\mu$m. Insulator films 5 of SiO$_2$ are formed on both sides of the gate electrode 4. A source N$^+$ region 2 and a drain N$^+$ region 3 are formed to attach the separate parts of the active region 1 and their neighbouring regions of the substrate 10 with a vapor phase deposition. The impurity concentration of the source and drain N+ regions 2 and 3 is, for example, about $10^{18}$ cm$^{-3}$. After the formations of the gate electrode 4, the side wall insulator films 5 and the N+ regions 2 and 3, the whole is annealed with a temperature of 800° C. Source and drain N+ ohmic metals 6 and 7 are formed to attach the source and drain N+ regions 2 and 3. The materials of the ohmic metals 6 and 7 are so selected that an ohmic contact is achieved with N+ type GaAs and are, for example, an alloy of gold, germanium and nickel. After SiO$_2$ passivation layer 11 is covered except for predetermined portions on the ohmic metals 6 and 7, wirings 8 and 9 for source and drain electrodes are deposited to contact with the ohmic metals 6 and 7 and to extend over the passivation layer 11.

Figure 4:
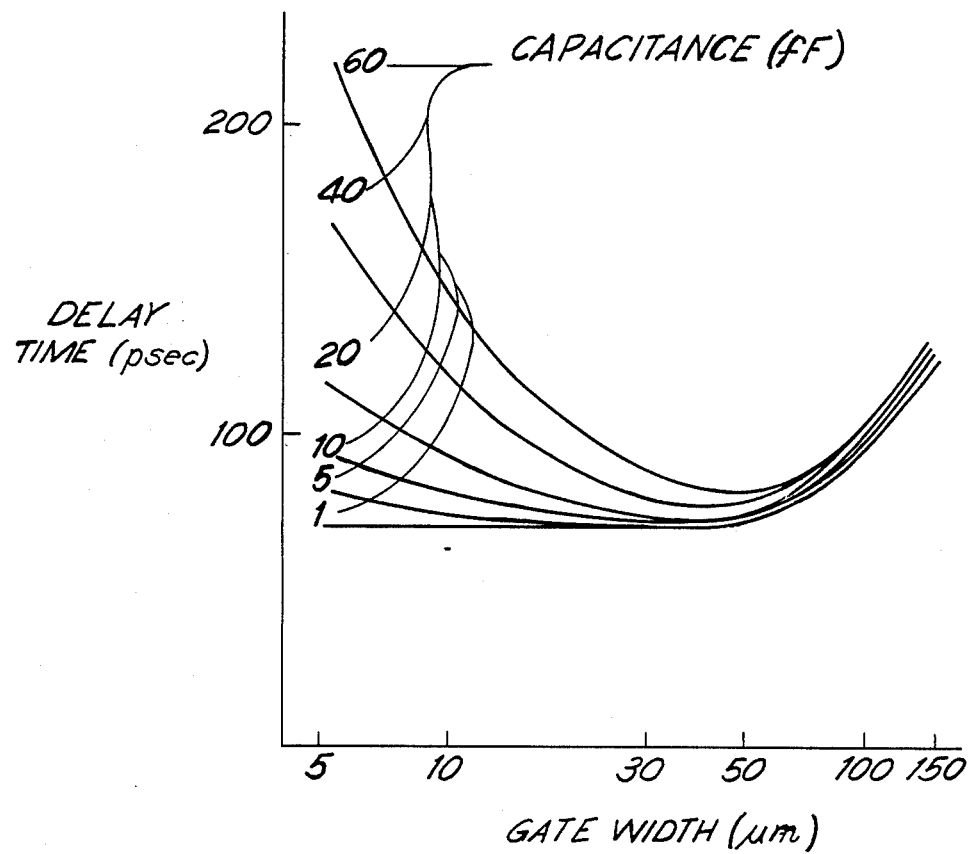
FIG. 4 is a graph showing a relationship of the first embodiment shown in FIGS. 1 and 2 between delay time of output from input and gate width with various coupling capacitances.

A power source is applied to the drain wiring 9 through a load impedance with a ground connection to the source wiring 8. A delay time of output signal at the drain wiring 9 from an input signal applied to the gate electrode 4 was examined with various gate width "W" from 5 μm to 150 μm and with various capacitance 1 to 60 fF applied to the drain wiring 9. The result is shown in FIG. 4. The examination was made with the FET having a WSi gate electrode of a thickness of 0.5 μm and gate length "L" of 1.0 μm. The similar result was also obtained with the FET having a WSi gate electrode of a gate length "L" of 0.5 μm.

As apparent from FIG. 4, the delay time becomes minimum and shows a nearly constant value with a gate width of 30 to 60 μm, irrespective of the applied capacitances. Thus, by selecting the gate width "W" of the gate electrode 4 as 30 to 60 μm, the FET can be operated with a constant and maximum operating speed. The gate length "L" and parasitic capacitance based on wirings or deviation of FET manufacturing process can be ignored to facilitate the circuit design and the manufacturing process control.

The formation of source and drain N+ regions can be modified as the N+ regions 2' and 3' shown in FIG. 3. In this modification, the side wall insulators 5 of FIGS. 1 and 2 may be used, but are removed in FIG. 3. After the WSi gate electrode 4 is formed by sputtering and selective etching, silicon ions are highly implanted into the substrate 10 with using the WSi gate electrode 4 as a part of ion-implantation mask. Thereafter, the whole is subjected to an anneal with a temperature of 800° C. to activate the implanted silicon ions and to form N+ regions 2' and 3'. The formation of ohmic metals 6 and 7 and the formation of wirings 8 and 9 are made similarly to the first embodiment explained in connection with FIGS. 1 and 2.

According to the modification of the first embodiment, the source and drain N+ regions 2' and 3' are formed under an alignment with sides of the WSi gate electrode 4. The size of FET can be miniaturized. The high and constant operation speed is similarly obtained to the first embodiment of FIGS. 1, 2 and 4.

FIG. 5 is a second embodiment applying the present invention to an FET operable at a large current. Drawings of FIG. 5 is simplified by neglecting ohmic metal between source and drain N+ regions 22 and 23 and source and drain wirings 28 and 29 for the purpose of facilitation only. The ohmic metal of an alloy of gold, germanium and nickel should be used in the actual device. The FET has four gate fingers connected in common to form a gate electrode 24. Three source regions and two drain regions are alternatively formed. Each gate fingers are respectively formed between the source and drain regions.

More specifically, a GaAs active region 21 of N-type is formed in a semi-insulating GaAs substrate 20. The width of the active region 21 defines a gate width "W" and is selected as 30 to 60 μm. Similarly to the first embodiment, the WSi gate electrode 24 is formed with a pattern having four gate fingers. Each finger contacts the active region 21 to form a Schottky contact and has side wall insulator films (not shown in FIG. 5) on both side surfaces. Source and drain N+ regions 22 and 23 are alternatively formed with an alignment of their sides with the side wall insulator films. A source wiring 28 is formed to connect the source N+ regions 22 through ohmic metals (not shown in FIG. 5). A drain wiring 29 is formed to connect the drain N+ regions 23 through ohmic metals (not shown in FIG. 5).

According to the second embodiment, so long as the gate width "W" of each gate finger is designed as 30 to 60 μm, the operational speed of the whole transistor keeps high and constant value. Thus, operational current can be increased without degradation of operational speed by increasing the number of gate fingers. The self-alignment process can be applied by forming the source and drain N+ regions 22 and 23 with the ion-implantation using the WSi gate fingers or the WSi gate fingers and the side wall insulator films as a part of implantation mask.

FIG. 6 is an example of an equivalent circuit which may be formed in an GaAs IC using FET's of the present invention. The inverter of FET's 31 and 32 is a part of inner logic section and is formed by the FET's of the first embodiment of FIGS. 1 and 2 or the FET's of the its modification of FIG. 3. Another inverter of FET's 34 and 35 forms an output section and is formed by the FET's of the second embodiments of FIG. 5. The capacitor 33 shows a stray capacitance due to wiring from the preceeding stage inverter to the output stage inverter. The capacitor 36 is a stray capacitance due to wirings from the output stage inverter to the output terminal 37. The capacitances of those stray capacitors 33 and 36 are generally less than 60 fF in an IC. Therefore, the operational speed or switching speed of the whole circuit keeps high and constant value and is not affect from circuit design variation or deviation of manufacturing condition.

What is claimed is:

1. A GaAs field effect transistor comprising a GaAs substrate having an impurity concentration of 1 to $4 \times 10^{17}$ cm$^{-3}$, source and drain electrodes attached to separated first and second parts of said GaAs substrate and a gate electrode made of WSi attached to a third part of said GaAs substrate between said first and second parts and forming a Schottky junction with said third part of said GaAs substrate, said gate electrode having a thickness of 2000 to 5000 Å, a gate length of 0.5 to 1.5 μm in a direction from said first part to said second part of said GaAs substrate, and a gate width of 30 to 60 μm in a second direction perpendicular to said first direction.

2. A field effect transistor comprising:
a substrate of semi-insulating GaAs;
an active region of GaAs formed in said substrate with one conductivity type and having a first impurity concentration of 1 to $4 \times 10^{17}$ cm$^{-3}$.
separated two high impurity concentration regions of GaAs having said one conductivity type contacting said active region, said two high impurity concentration having a second impurity concentration higher than said first impurity concentration;

a source electrode ohmically connected one of said two high impurity concentration regions;

a drain electrode ohmically connected the other of said two high impurity concentration region; and a gate electrode made of WSi and contacting said active region between said two high impurity concentration regions to form a Schottky junction, said gate electrode having a thickness of 2000 to 5000 Å, a length of 0.5 to 1.5 μm in a first direction from one to the other of said two high impurity concentration regions, a width of 30 to 60 μm in a second direction perpendicular to said first direction.

3. A field effect transistor as claimed in claim 2, wherein said high impurity concentration regions are formed on said active region.

4. A field effect transistor as claimed in claim 2, wherein said high impurity concentration region are formed in said substrate to overlap said active region.

5. A field effect transistor comprising:

a substrate of semi-insulating GaAs;

an active region of GaAs formed in said substrate with one conductivity type;

a plurality of high concentration region of GaAs overlapping said active region and aligned in a line;

a plurality of gate fingers of WSi contacting said active region between said high concentration regions, each of said gate fingers having a thickness of 2000 to 5000 Å, a gate length of 0.5 to 1.5 μm in a first direction parallel to said line and, a gate width of 30 to 60 μm in a second direction perpendicular to said first direction;

a means for connecting said gate fingers in common;

a source electrode ohmically contacting with every other high concentration regions; and a drain electrode ohmically contacting with remaining high concentration regions.

6. A GaAs field effect transistor comprising:

a GaAs substrate having an impurity concentration of 1 to $4 \times 10^{17}$ cm$^{-3}$ and having a plurality of first parts, a plurality of second parts and a plurality of third parts, each of said third parts positioned between one of said first parts and one of said second parts;

a source electrode having a plurality of source fingers connected in common for external connection, each of said source fingers being attached to respective one of said first parts;

a drain electrode having plurality of drain fingers connected in common for external connection, each of said drain fingers being attached to respective one of said second parts; and a gate electrode having a plurality of gate fingers connected in common for external connection, each of said gate fingers being made of WSi attached respectively to one of said third parts and having a thickness of 2,000 to 5,000Å, a length of 0.5 to 1.5 μm in a first direction from said first part to said second part of both sides of each of said third parts and a width of 30 to 60 μm in a second direction perpendicular to said first direction.

7. A GaAs field effect transistor comprising:

a GaAs substrate having a source region, a drain region and an active region, said active region positioned between said source region and said drain region;

source and drain electrodes attached to said source and drain regions of said GaAs substrate; and a gate electrode having a portion of WSi attached to said active region of said GaAs substrate, said portion having a thickness of 2,000 to 5000Å, a length of 0.5 to 1.5 μm in a first direction from said source region to said drain region, and a width of 30 to 60 μm in a second direction perpendicular to said first direction.

8. A GaAs field effect transistor as claimed in claim 7, wherein the numbers of said source, drain and active regions are respectively plural numbers, said source electrode having a plurality of source fingers each attached to respective one of said source regions, said drain electrode having a plurality of drain fingers each attached to respective one of said drain regions, and said gate electrode having a plurality of said portions connected with each other.

9. A GaAs field effect transistor as claimed in claim 7, wherein said GaAs substrate has a body of a semi-insulating GaAs, a layer of said active region formed on said semi-insulating GaAs body and said source and drain regions overlapping said layer of active region.

10. A GaAs field effect transistor as claimed in claim 9, wherein the numbers of said source, drain and active regions are respectively plural numbers, said source electrode having a plurality of source fingers each attached to respective one of said source regions, said drain electrode having a plurality of drain fingers each attached to respective one of said drain regions, and said gate electrode having a plurality of said portions connected with each other.

* * * * *